United States Patent [19]
Chang

[11] Patent Number: 6,130,839
[45] Date of Patent: Oct. 10, 2000

[54] METHODS OF PROGRAMMING, ERASING AND READING A FLASH MEMORY

[75] Inventor: Kuang-Yeh Chang, Taipei, Taiwan

[73] Assignee: United Microelectronics Corp., Shinchu, Taiwan

[21] Appl. No.: 09/179,738

[22] Filed: Oct. 27, 1998

[51] Int. Cl.[7] .................................................. G11C 16/04
[52] U.S. Cl. .............................. 365/185.18; 365/185.29; 365/185.17
[58] Field of Search ........................ 365/185.18, 185.28, 365/185.29, 104, 185.17

[56] References Cited

U.S. PATENT DOCUMENTS

| | | | |
|---|---|---|---|
| 5,654,917 | 8/1997 | Ogura et al. | 365/185.18 |
| 5,745,417 | 4/1998 | Kabayashi et al. | 365/185.29 |
| 5,831,894 | 11/1998 | Chang | 365/185.18 X |
| 6,009,013 | 12/1999 | Van Houdt et al. | 365/185.14 |

*Primary Examiner*—Huan Hoang

[57] ABSTRACT

A flash memory comprises a plurality of word lines, a plurality of source lines and a plurality of bit lines, the word lines are arranged in a matrix with the bit lines and the source lines, respectively. Between every two adjacent bit line and source line and on every word line there forms a memory cell. Each bit line and source line are coupled to memory cells of two columns. During the procedure of "erase", two columns of memory cells can be erased at the same time. Methods of programming, erasing and reading the flash memory are much easy and controllable.

4 Claims, 6 Drawing Sheets

METHODS OF PROGRAMMING, ERASING AND READING A FLASH MEMORY

BACKGROUND OF THE INVENTION

1. Field of Invention

This invention relates generally to methods of programming, erasing and reading a memory structure, and more particularly to methods of programming, erasing and reading a flash memory.

2. Background

Electrically erasable programmable read-only-memories (EEPROMs) are widely used as memory components for personal computers and electronic equipment. A conventional EEPROM memory cell comprises a floating gate transistor structure that is programmable, erasable and can store data. However, the conventional EEPROM suffers from a slow storage and retrieval time of typically around 150 ns to 200 ns. Recently, a faster EEPROM, such as a flash memory, has been developed having a storage and retrieval time of about 70 ns to 80 ns.

A conventional floating gate transistor relies on hot electrons and the nature of Fowler-Nordheim tunneling to store data. For example, when the flash memory stores data, a high voltage, on the order of 8 volts, is applied between the source region and the drain region. A high voltage is also applied to the control gate. Hot electrons generated in the channel region will flow into the floating gate through the tunneling oxide layer near the drain region to be stored in the floating gate. By this mechanism, the threshold voltage of the floating gate transistor is raised to store data.

When the data is to be erased, a negative voltage is applied to the control gate. The electrons previously trapped in the floating gate will tunnel through the tunneling oxide layer to erase the data, and the floating gate comes back to the uncharged state. In the erasing process, the erasing time takes a long time to ensure the uncharged state of the floating gate.

Figure 1:
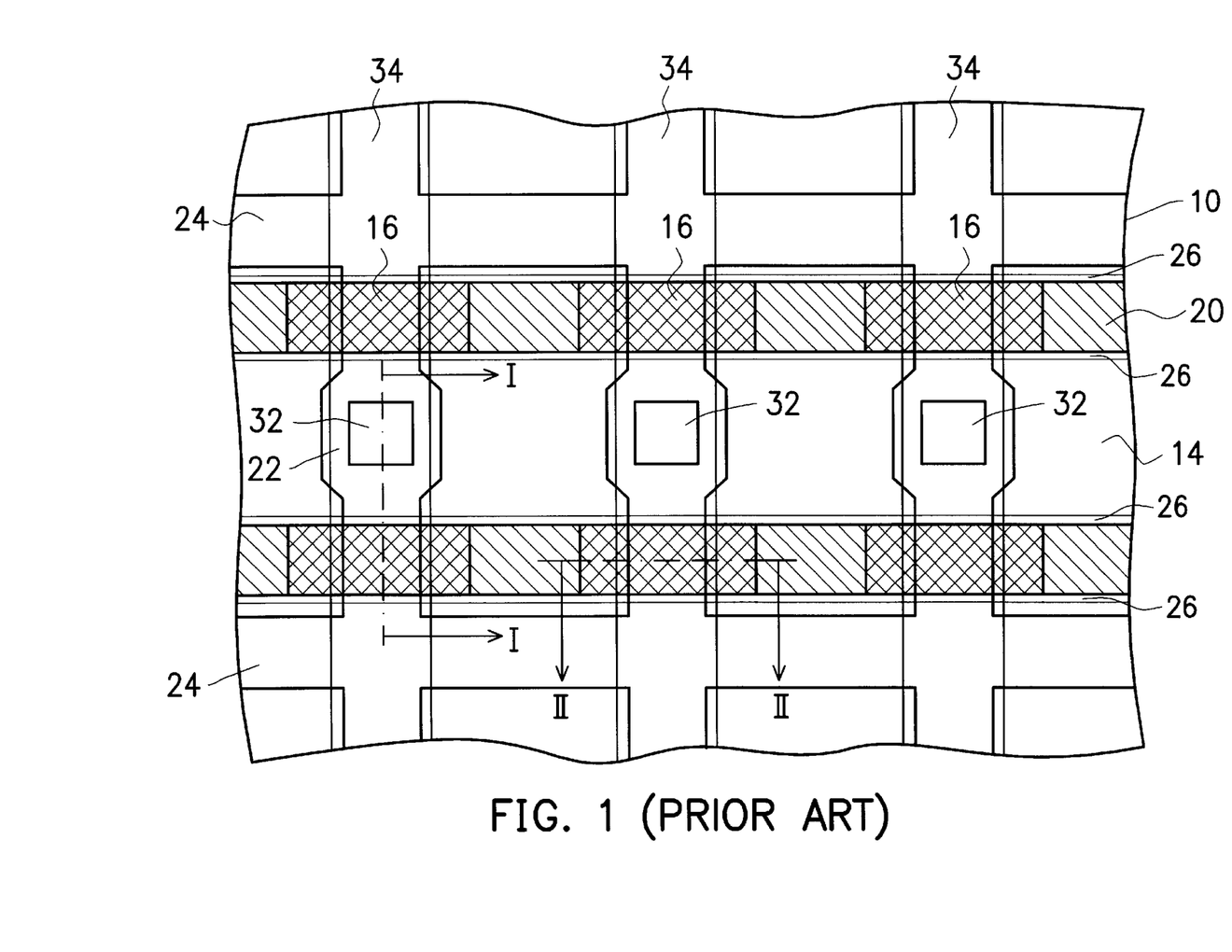
FIG. 1 is a schematic layout of a conventional flash memory.
Figure 2:
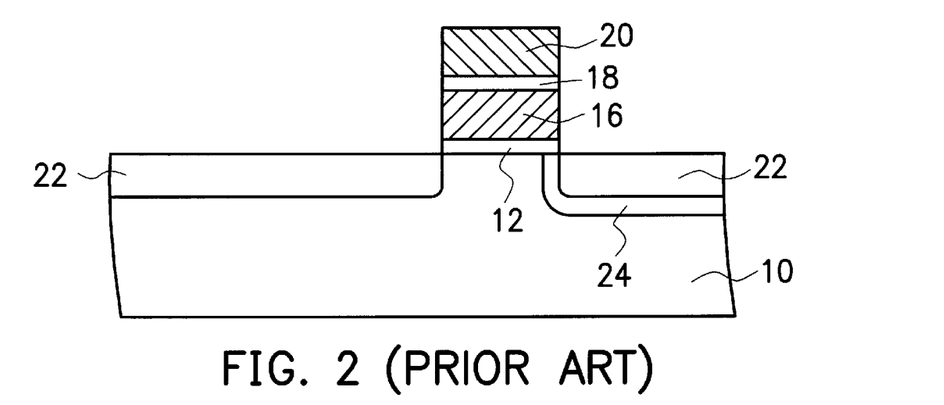
FIGS. 2 to 4 are cross sectional views taken along the line I—I in FIG. 1, schematically illustrating the fabrication process.
Figure 3:
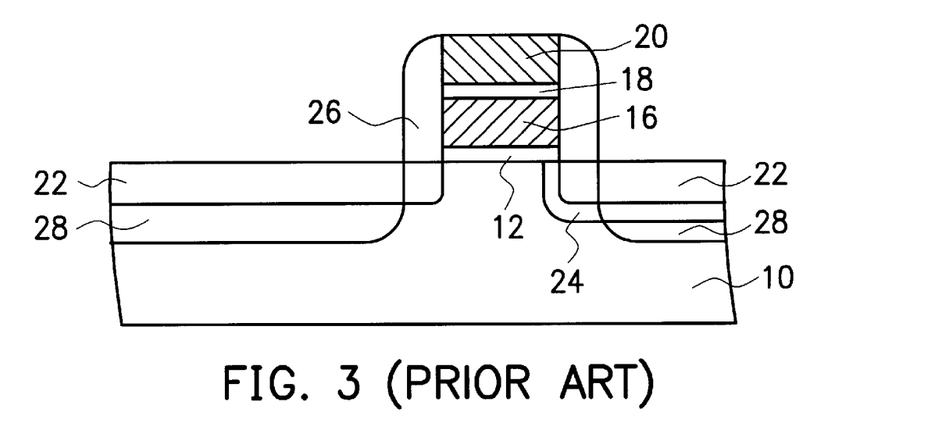
Figure 4:
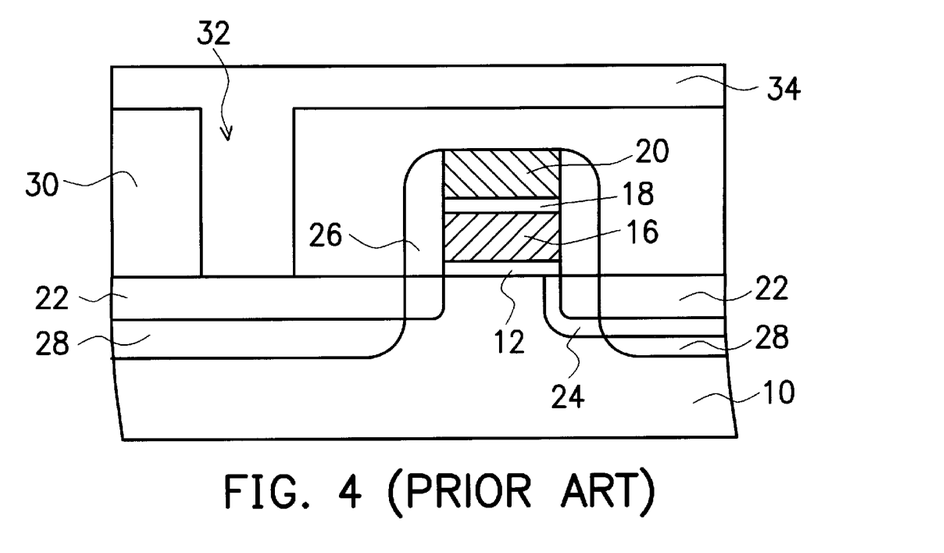
Figure 5:
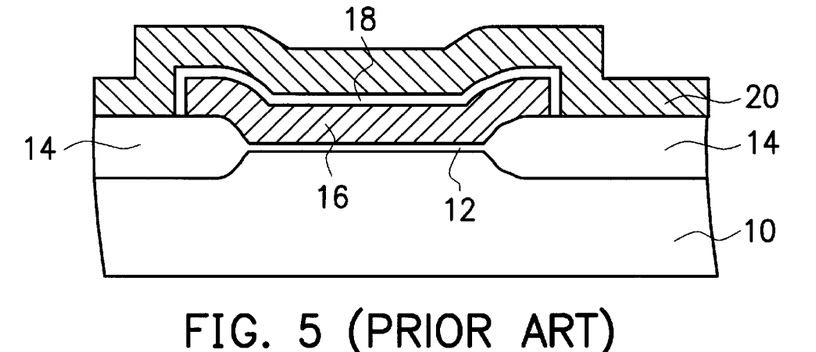
FIGS. 5 to 6 are cross sectional views taken along the line II—II in FIG. 1, schematically illustrating the fabrication process.
Figure 6:
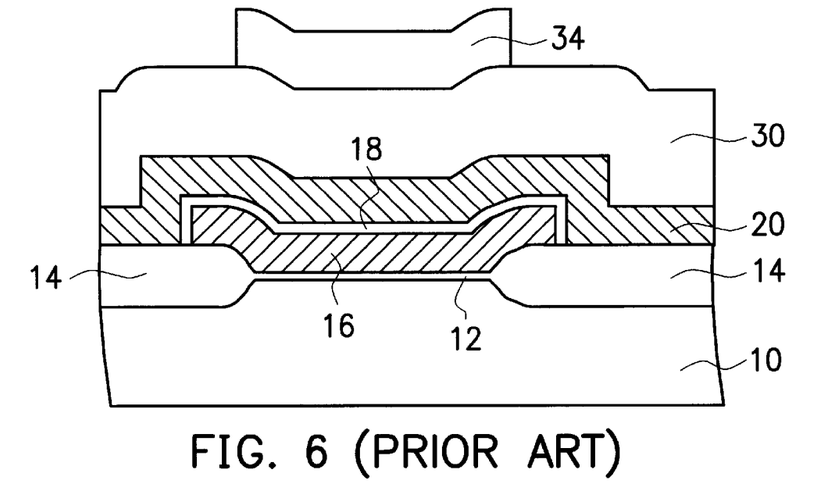

FIG. 1 is a schematic layout of a conventional flash memory. FIGS. 2 to 4 are cross sectional views taken along the line I—I in FIG. 1, schematically illustrating the fabrication process. FIGS. 5 to 6 are cross sectional views taken along the line II—II in FIG. 1, schematically illustrating the fabrication process. The manufacturing method of the conventional flash memory is described as below.

Referring to the FIGS. 2 and 5, first, on a substrate 10, a pad oxide layer (not shown) is formed by thermal oxidation. Active regions are then defined by forming field oxide layer 14, using local oxidation. The pad oxide layer is then removed away by wet etching. Next, by thermal oxidation, a tunneling oxide layer 12 with a thickness of about 100 Å, is formed on the surface of the device regions. Then, a polysilicon layer is formed on the tunneling oxide layer 12 by low pressure chemical vapor deposition (LPCVD). The polysilicon layer is then defined by photolithography and etching to form a polysilicon layer 16 with a thickness of about 1500 Å.

Next, an inter-poly dielectric layer is formed by, for example, LPCVD, and covers the polysilicon layer 16. The inter-poly dielectric layer has a thickness of about 250 Å and constructed by oxide/nitride/oxide layers. Then, another layer of polysilicon with a thickness of about 3000 Å is formed on the polysilicon layer 16. Both the inter-poly dielectric layer and the polysilicon layer are patterned by photolithography and etching to be an inter-poly dielectric layer 18 and polysilicon layer 20. The polysilicon layer 20 is utilized as a control gate of the flash memory.

Then, by using the polysilicon layer 20 as a mask, the polysilicon layer 16 is further patterned by etching. A process of implanting ions is next performed by using the polysilicon layer 20 as a mask to form an implantation region 22 with a higher density of doped ions than that of the substrate. A gate electrode of the flash memory is constituted by the polysilicon layer 20, inter-poly dielectric layer 18, polysilicon layer 16 and tunneling oxide layer 12.

Thereafter, the semiconductor substrate is patterned by using a mask (not shown), exposing the implantation region 22 located at one side of the gate electrode. A process of implanting ions is next performed by using a tilted angle to implant dopant into substrate 10, and a process of annealing is performed to form a diffusion region 24. The diffusion region 24 is located at around of the implantation region 22, elongated to the place below the gate electrode. The implantation region 22 is surrounded by the diffusion region 24. The mask (not shown) is removed after the diffusion region 24 is formed.

Referring to FIG. 3, a layer of oxide is deposited over the whole surface of the substrate structure by using LPCVD. An etching back method is then performed on the oxide layer to form spacers 26 on sidewalls of the gate electrode. Thereafter, an implantation region 28 is formed by using a process of implanting ions to implant ions into the substrate 10 as illustrated in FIG. 3. The cross sectional view taken along with the line II—II in FIG. 3 is the same as the FIG. 5.

Referring to FIGS. 4 and 6, a dielectric layer 30 is formed over the whole substrate structure by using LPCVD. A contact opening 32 is formed on the dielectric layer 30, exposing the implantation region 22, by using lithography and etching. Then, a metal layer 34 acting as a bit line is formed over the dielectric layer 30 by LPCVD, filling the contact opening 32 so that the metal layer 34, also known as the bit line, is electrically coupled to the implantation region 22. A conventional procedure is followed to complete fabrication of the flash memory. This procedure is familiar to those skilled in the art and therefore is not described here.

Figure 7:
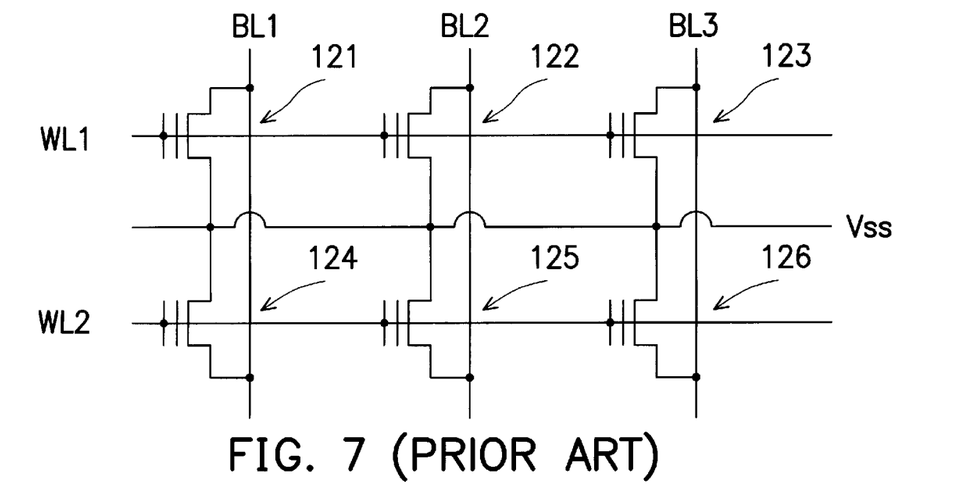
FIG. 7 illustrates a partial circuit diagram of a conventional read only access memory.

FIG. 7 illustrates a partial circuit diagram of a conventional read only access memory. FIG. 7 is an example of a 2×3 matrix including 2 arrays or rows of memory cells and 3 columns of memory cells. FIG. 7 shows 6 memory cells, 2 word lines along the rows and 3 bit lines along the columns. Each memory cell in one array or rows is coupled to different bit lines BL but coupled to one equal word line WL. Memory cells in one column coupled to one equal bit line BL but memory cells in different arrays are coupled to different word lines WL.

Number 121, 122, 123, 124, 125, and 126, each represent one memory cell. Memory cells 121 and 124 both are coupled to the bit line BL1 and are coupled to the word line WL1 and the word line WL2, respectively. Memory cells 122 and 125 both are coupled to the bit line BL2 and are coupled to the word line WL1 and the word line WL2, respectively. Memory cells 123 and 126 both are coupled to the bit line BL3 and are coupled to the word line WL1 and the word line WL2, respectively. Memory cells 121, 122 and 123 are all coupled to the word line WL1 and memory cells 124, 125 and 126 are all coupled to the word line WL2. Another terminal of the memory cells is coupled to the ion implantation region Vss.

The conventional memory cells have several drawbacks. First, during programming and reading, different voltage has to be supplied to the corresponding bit line BL, word line WL and ion implantation region Vss of each memory cell, which is complex.

For example, during the programming of the memory cell 122, 12 volts has to be supplied to the word line WL1, 8 volts has to be supplied to the bit line BL2 and the ion implantation region Vss has to be grounded. However, during the programming of other memory cells in the same array, another voltage has to be supplied to the corresponding bit line BL of the memory cell. Therefore, the programming procedure is quite laborsome. Second, it is also complicated during the procedures of "read" or "erase". During the procedure of "read" or "erase", different voltage has to be supplied to the corresponding bit line BL, word line WL and ion implantation region Vss of each memory cell. Moreover, one procedure of erase can erase only one row of memory cells, because one Word line WL only couples to one row of memory cells. Therefore, the erasing procedure is quite laborsome.

In the conventional method described above, it is difficult to effectively reduce the flash memory size because it is limited by the size of the contact opening. The existence of the field oxide layer 14 also affects the size reduction and planarization of the active region. Besides that, since the metal layer 34 also has to fill the contact opening 32 in order to serve as the bit line, interference due to signal reflection from the metal layer 34 is inevitable.

SUMMARY OF THE INVENTION

It is therefore an objective of the present invention to provide a flash memory for solving one or more of the conventional problems.

The invention achieves the above-identified objects by providing a method of programming a flash memory, wherein the flash memory comprises a plurality of word lines, a plurality of source lines and a plurality of bit lines, the word lines are arranged in a matrix with the bit lines and the source lines, respectively, and between every two adjacent bit line and source line and on every word line there forms a memory cell, wherein the method of programming the flash memory comprises the steps of: supplying a first voltage to the bit line on the memory cell; supplying a second voltage to the source line on the memory cell; supplying a third voltage to the word line; supplying said first voltage to bit lines and source lines on the same side of the bit line; and supplying said second voltage to bit lines and source lines on the same side of the source line, wherein the first voltage is 8 volts, the second voltage is a grounded voltage and the third voltage is 12 volts.

The invention also provides a method of erasing a flash memory, that comprises a plurality of word lines, a plurality of source lines and a plurality of bit lines, where the word lines are arranged in a matrix with the bit lines and the source lines, respectively, and between every two adjacent bit line and source line and on every word line there forms a memory cell. The method of erasing the flash memory comprises the steps of: supplying a first voltage to the bit line on the memory cell; supplying a second voltage to the source line on the memory cell; supplying said first voltage to the word line; supplying said first voltage to bit lines and source lines on the same side of the bit line; and supplying said first voltage to bit lines and source lines on the same side of the source line, wherein the first voltage is a grounded voltage and the second voltage is 16 volts.

The invention also provides a method of reading a flash memory having a plurality of word lines, a plurality of source lines and a plurality of bit lines, the word lines are arranged in a matrix with the bit lines and the source lines, respectively, and between every two adjacent bit line and source line and on every word line there forms a memory cell. The method of reading the flash memory comprises the steps of: supplying a first voltage to the bit line on the memory cell; supplying a second voltage to the source line on the memory cell; supplying a third voltage to the word line; supplying said first voltage to bit lines and source lines on the same side of the bit line; and supplying said second voltage to bit lines and source lines on the same side of the source line, wherein the first voltage is 1.5 volts, the second voltage is a grounded voltage and the third voltage is 5 volts.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 8:
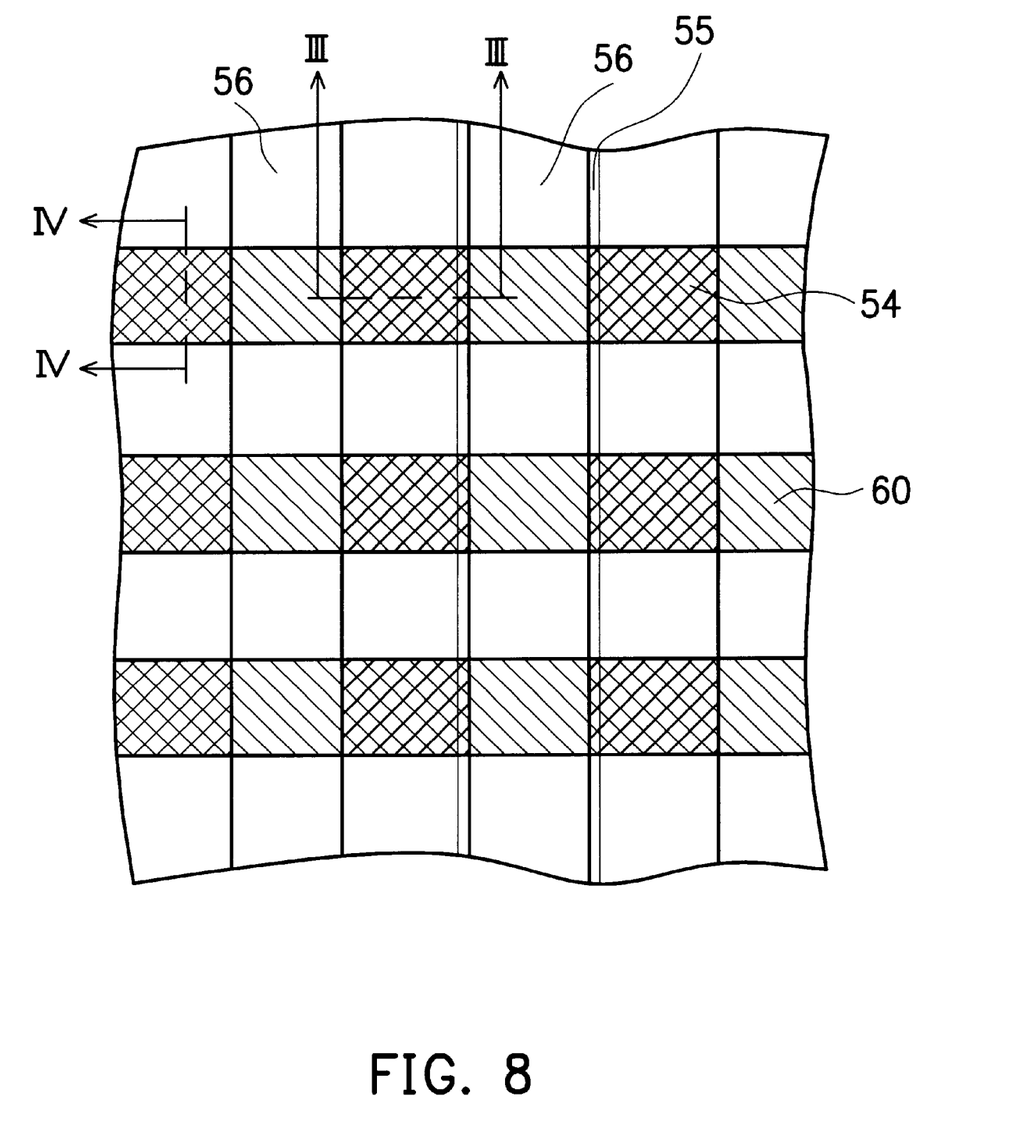
FIG. 8 is a schematic layout of a flash memory according to the preferred embodiment of the invention.
Figure 9:
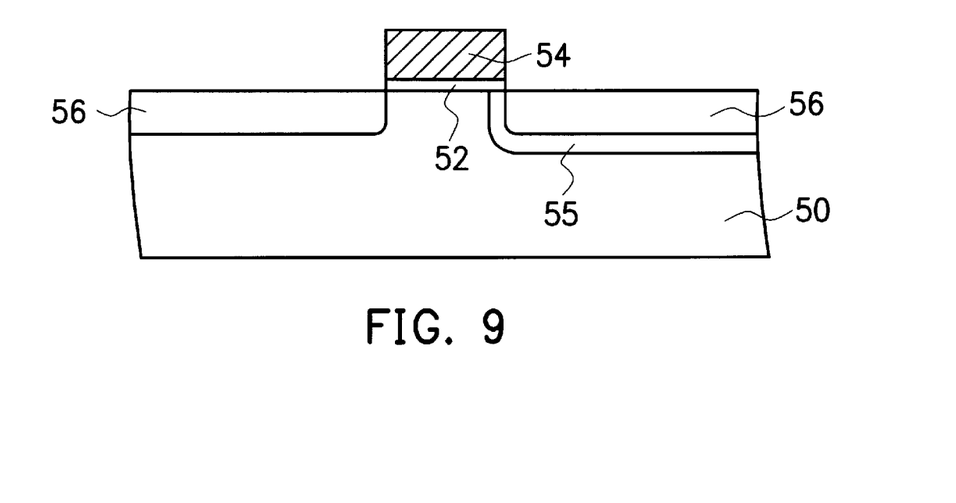
FIGS. 9 to 10 are cross sectional views taken along the line III—III in FIG. 8 schematically illustrating the fabrication procedure.
Figure 10:
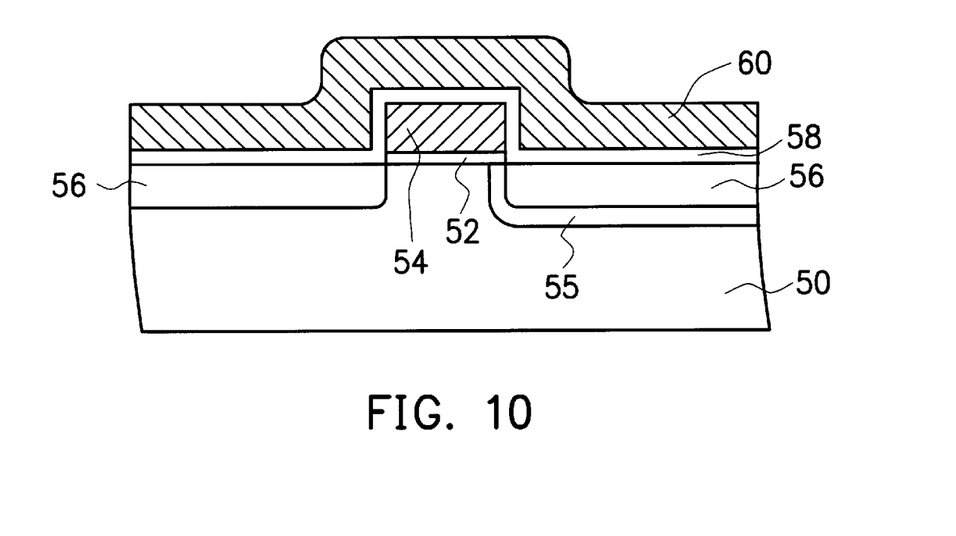
Figure 11:
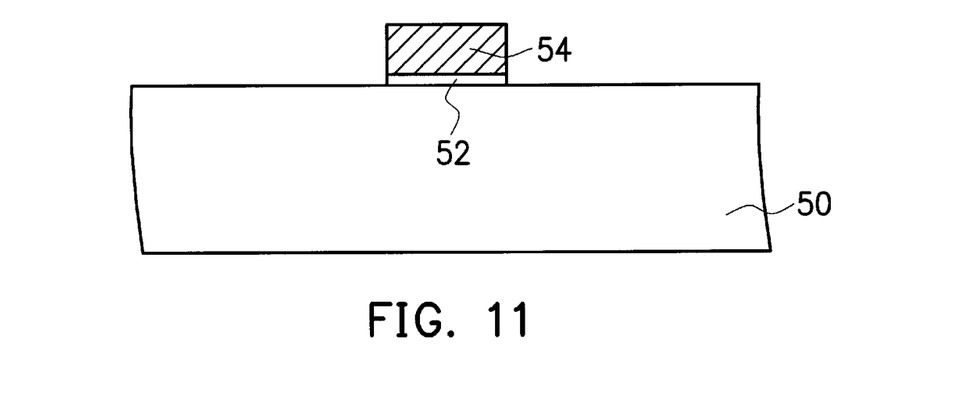
FIGS. 11 to 12 are cross sectional views taken along the line IV—IV in FIG. 8 schematically illustrating the fabrication procedure.
Figure 12:
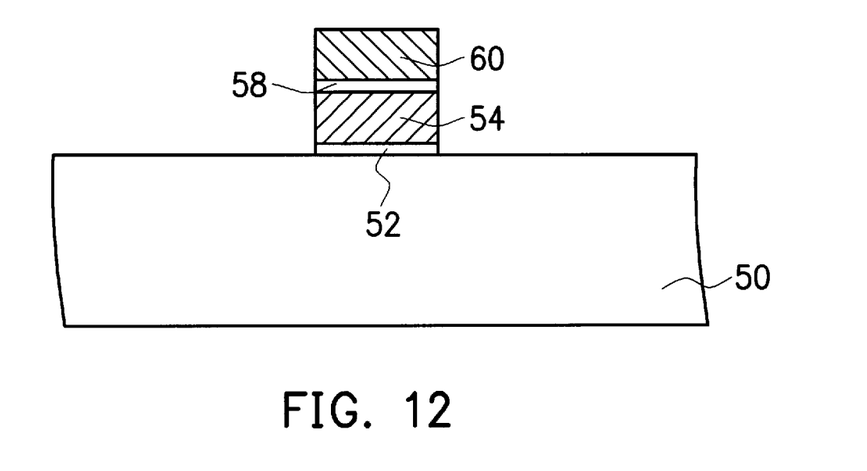

FIG. 8 is a schematic layout of a flash memory according to the preferred embodiment of the invention. FIGS. 9 to 10 are cross sectional views taken along the line III—III in FIG. 8 schematically illustrating the fabrication procedure. FIGS. 11 to 12 are cross sectional views taken along the line IV—IV in FIG. 8 schematically illustrating the fabrication procedure.

Referring to FIG. 9 and FIG. 11, a thermal oxidation process is performed on a semiconductor substrate 50 to form a layer of oxide material having a thickness of about 100 Å. Then, polysilicon material is deposited over the oxide material layer by LPCVD, and these two layers are patterned by photolithography and etching to form a polysilicon layer 54 and tunneling oxide layer 52. The surface of the substrate 50 is exposed by both sides of the polysilicon layer 54.

Then, the substrate structure is patterned by a mask (not shown) to selectively expose the substrate's surface which is exposed by the polysilicon layer 54. That is, only one side of the exposed surface is exposed. An ion implanting process is performed to implant ions, for example, P ions, by a slantindicular angle into the surface of the substrate 50 exposed by the mask. A process of annealing is performed to form a diffusion region 55. The diffusion region 55 acting as a buried bit line is lateral elongated to the place below the polysilicon layer 54. The mask (not shown) is removed after the diffusion region 55 is formed.

Then, a self-aligned implanting process is performed by using the patterned polysilicon layer 54 as a mask, so that doping ions, for example, As ions, through the oxide layer 52 into the substrate 50 on both sides of the polysilicon layer 54. A process of annealing is performed to form implantation regions 56. The implantation region 56 on one side of the polysilicon layer 54 is located on diffusion region 55 and is surrounded by the diffusion region 55. The ion dosages of the implantation regions 56 are larger than that of the diffusion region 55.

It is advantageous to have the implantation region 56 acting as a source line and being formed by performing a self-aligned technology.

Referring to FIGS. 10 and 12, next, an inter-poly dielectric material is formed by, for example, LPCVD, and covers the polysilicon layer 54. The inter-poly dielectric material has a thickness of about 250 Å and constructed by oxide/nitride/oxide layers. Then, another layer 60 of polysilicon with a thickness of about 3000 Å is formed on the inter-poly dielectric material layer.

The polysilicon layers are patterned by using a mask (not shown) and etching process. The polysilicon layer 60 is utilized as a control gate of the flash memory. The elongation direction of the polysilicon layer 60 is aligned with and about perpendicular to that of the implantation regions 56. Thereafter, the same mask and etching process as used in the patterning step of the polysilicon layer, are used again to further etch the polysilicon layer 54 and inter-poly dielectric material layer and form the polysilicon layer 54 and inter-poly dielectric layer 58 as illustrated in FIG. 10. The polysilicon layer 54 is used as a floating gate of the flash memory. The etching step in the patterning process of the polysilicon layer 54 can be a self-aligned etching step. A conventional procedure is followed to complete fabrication of the flash memory. This procedure is familiar to those skilled in the art and therefore is not described here.

Figure 13:
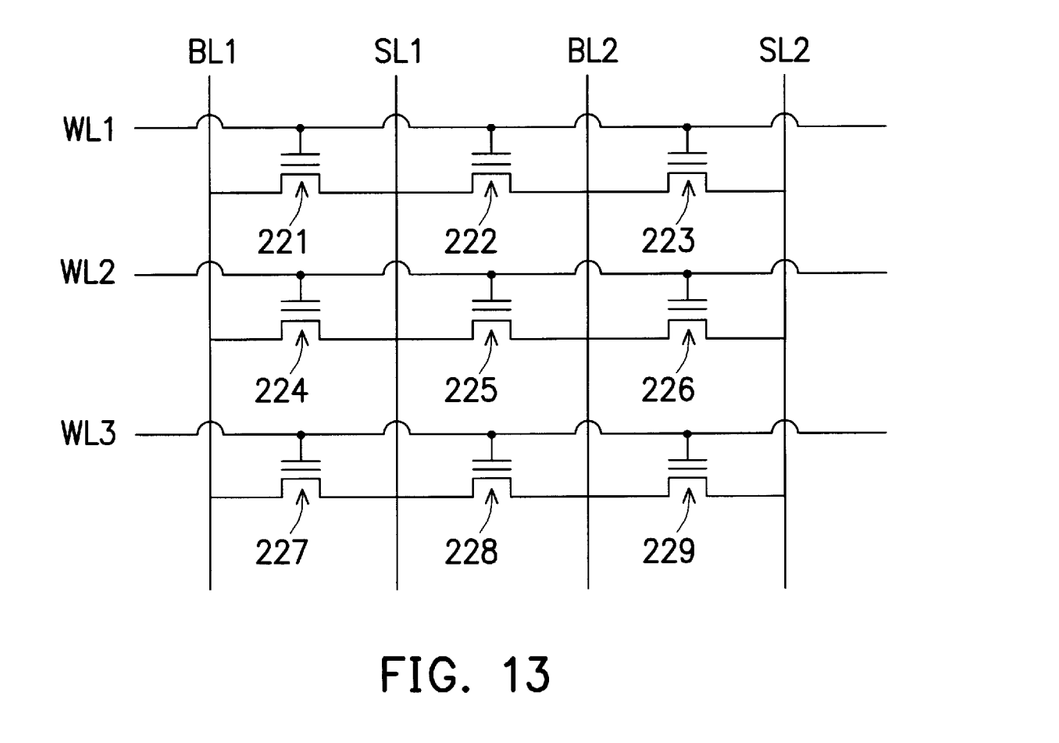
FIG. 13 illustrates a partial circuit diagram of a flash memory according to the preferred embodiment of the invention.

Referring to FIG. 13, a 3×3 matrix structure is taken as an example. FIG. 13 shows nine memory cells (221–229), three word lines (WL1–WL3), two bit lines (BL1–BL2) and two source lines (SL1–SL2). Each memory cell in one array (row) is coupled to different bit lines but coupled to one word line. Each memory cell in one column is coupled to two word lines but memory cells in different arrays (rows) are coupled to different word lines.

Number 221, 222, 223, 224, 225, 226, 227, 228 and 229 each represents one memory cell. The first column of memory cells 221, 224 and 227 are all coupled to the bit line BL1 and the source line SL1, and are coupled to the word line WL1, the word line WL2 and the word line WL3, respectively. The second column of memory cells 222, 225 and 228 are all coupled to the bit line BL2 and the source line SL1 and are coupled to the word line WL1, the word line WL2 and the word line WL3, respectively. The third column of memory cells 223, 226 and 229 are all coupled to the bit line BL2 and the source line SL2 and are coupled to the word line WL1, the word line WL2 and the word line WL3, respectively.

The flash memory of the invention has a simpler procedure of "read" and "program" than the conventional one. For example, during programming of the memory cell 222, only a voltage, such as 8 volts, has to be supplied to the bit line BL2. Source line SL1 is grounded. Bit lines on the same side of SL1 on the selected memory cell 222 are grounded and these bit lines can be BL1. Source lines on the same side of BL2 on the selected memory cell 222 are supplied with a voltage of, for example, 8 volts and these source lines can be such as SL2. The voltage difference of the bit line BL2 and the source line SL1 has to be large enough for programming. Another voltage sufficient for programming, such as 12 volts, is supplied to the word line WL1 coupled to the memory cell 222.

During the procedure of "erase", only one voltage has to be supplied to the source line on the selected memory cell. The voltage is, for example, 16 volts. The voltage supplied to bit lines and source lines on the same side of the source line on the selected memory cell is 0. The voltage supplied to bit lines and source lines at the different side of the source line on the selected memory cell is 0. Voltage, such as 0 volts, is supplied to the word line coupled to the selected memory cell. During the procedure of "erase", two columns of memory cells can be erased at the same time. That is, only one voltage, for example, 16 volts, has to be supplied to source line SL1, and the memory cells at both sides of the SL1 can be erased at the same time.

During the procedure of "reading", only one voltage has to be supplied to the bit line on the selected memory cell. The voltage is, for example, 1.5 volts. The voltage supplied to source line and bit lines at one side of the memory cell is 0 volt. The voltage supplied to source lines and bit lines at another side of the memory cell is 1.5 volts. Another voltage, such as 5 volts, is supplied to the word line coupled to the selected memory cell.

The invention advantageously uses an ion implanting process in a self-aligned technology, by using the polysilicon layer 54 as a mask to form a buried bit line 56. The contact opening is unnecessary and interference from the signal reflection of metal in the contact opening is avoided.

Moreover, since the field oxide layer is unnecessary in this invention, the size is greatly reduced and a higher quality of planarization of the active region is achieved.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A method of programming a flash memory, wherein the flash memory comprises a plurality of spaced conductive lines sequentially having a first bit line, a first source line, a second bit line, and a second source line, and comprises a word line electrically connected to and substantially perpendicular to the conductive lines, respectively, and wherein between the first source line and the second bit line there is a memory cell formed on the word line, the method of programming a flash memory comprising:

supplying a first voltage to the second bit line and the second source line;

grounding the first bit line and the first source line; and supplying a second voltage to the word line, wherein the second voltage is higher than the first voltage.

2. A method according to claim 1, wherein the first voltage is 8 volts.

3. A method according to claim 1, wherein the second voltage is 12 volts.

4. A method of erasing a flash memory, wherein the flash memory comprises a source line and two bit lines alternatively spaced from each other, and comprises a word line substantially perpendicular to the source line and the bit lines, respectively, and wherein between each of the two bit lines and the source line there is a memory formed on the word line, the method of erasing the flash memory comprising:

supplying a voltage to the source line, thereby simultaneously erasing the two memory cells between the source line and the two bit lines;

wherein the voltage is 16 volts and the bit lines are grounded.

\* \* \* \* \*